United States Patent
He et al.

(10) Patent No.: US 10,509,516 B2
(45) Date of Patent: Dec. 17, 2019

(54) TOUCH PANEL MANUFACTURING METHOD, TOUCH PANEL, TOUCH SCREEN AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Min He, Beijing (CN); Ming Hu, Beijing (CN); Zhizhong Tu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 98 days.

(21) Appl. No.: 14/895,454

(22) PCT Filed: May 12, 2015

(86) PCT No.: PCT/CN2015/078743
§ 371 (c)(1),
(2) Date: Dec. 2, 2015

(87) PCT Pub. No.: WO2016/101495
PCT Pub. Date: Jun. 30, 2016

(65) Prior Publication Data
US 2016/0364041 A1 Dec. 15, 2016

(30) Foreign Application Priority Data
Dec. 25, 2014 (CN) .......................... 2014 1 0827968

(51) Int. Cl.
*G06F 3/044* (2006.01)
*C03C 17/245* (2006.01)
(Continued)

(52) U.S. Cl.
CPC .......... *G06F 3/044* (2013.01); *C03C 17/2453* (2013.01); *C03C 17/2456* (2013.01);
(Continued)

(58) Field of Classification Search
CPC .................. G06F 3/044; G06F 3/0412; G06F 2203/04103; C03C 17/2453;
(Continued)

(56) References Cited

U.S. PATENT DOCUMENTS

2005/0075429 A1 4/2005 Harashina
2010/0245285 A1* 9/2010 Wang ...................... G06F 3/044
345/174

(Continued)

FOREIGN PATENT DOCUMENTS

CN 103116433 A 5/2013
CN 203133803 U 8/2013
(Continued)

OTHER PUBLICATIONS

Office Action in Chinese Patent Application No. 201410827968.1, dated Dec. 26, 2016.
(Continued)

*Primary Examiner* — Sahlu Okebato
(74) *Attorney, Agent, or Firm* — Brooks Kushman P.C.

(57) ABSTRACT

The present disclosure provides a method for manufacturing a touch panel, the touch panel, a touch screen and a display device. The method includes steps of: forming, on a transparent substrate, a non-opaque film layer with a micro-pattern; and forming a touch panel electrode on the non-
(Continued)

micro-pattern 32 opaque film layer. The non-opaque film layer is configured to vanish a shadow of the touch panel electrode.

13 Claims, 2 Drawing Sheets

(51) Int. Cl.
*C23C 14/08* (2006.01)
*C23C 14/34* (2006.01)
*G06F 3/041* (2006.01)

(52) U.S. Cl.
CPC ............ *C23C 14/086* (2013.01); *C23C 14/34* (2013.01); *G06F 3/0412* (2013.01); *C03C 2217/231* (2013.01); *C03C 2217/73* (2013.01); *C03C 2217/948* (2013.01); *C03C 2218/154* (2013.01); *C03C 2218/33* (2013.01); *G06F 2203/04103* (2013.01)

(58) Field of Classification Search
CPC ..... C03C 17/2456; C03C 1/086; C03C 14/34; C03C 2217/231; C03C 2217/73; C03C 2217/948; C03C 2218/154; C03C 2218/33
See application file for complete search history.

(56) References Cited

U.S. PATENT DOCUMENTS

| 2012/0177920 | A1* | 7/2012 | Huang | C07F 7/21 428/402 |
| 2013/0020110 | A1* | 1/2013 | Jo | B29C 43/222 174/251 |
| 2015/0084907 | A1* | 3/2015 | Burberry | G06F 3/046 345/174 |
| 2015/0277616 | A1* | 10/2015 | Wang | G06F 3/044 345/174 |

FOREIGN PATENT DOCUMENTS

| CN | 103294310 A | 9/2013 |
| CN | 203773519 U | 8/2014 |
| CN | 104461157 A | 3/2015 |
| CN | 204423336 U | 6/2015 |

OTHER PUBLICATIONS

Written Opinion of the International Searching Authority, PCT/CN20151078743, dated May 12, 2015.

* cited by examiner

TOUCH PANEL MANUFACTURING METHOD, TOUCH PANEL, TOUCH SCREEN AND DISPLAY DEVICE

CROSS-REFERENCE TO RELATED APPLICATION

This application is the U.S. national phase of PCT Application No. PCT/CN2015/078743 filed on May 12, 2015, which claims a priority of the Chinese Patent Application No. 201410827968.1 filed on Dec. 25, 2014, the disclosures of which are incorporated in their entirety by reference herein.

TECHNICAL FIELD

The present disclosure relates to the field of touch display, and in particular to a method for manufacturing a touch panel, a touch panel, a touch screen and a display device.

BACKGROUND

New-generation one glass solution (OGS, where an indium tin oxide (ITO) conductive film and a sensor are directly formed on a protective glass substrate) product is a new trend of capacitive touch screens. Compared with a product with a sensor glass/tempered glass (G/G) cover plate, one glass substrate is saved in the OGS product, thereby reducing the production cost and improving the yield.

A process of manufacturing a traditional OGS product includes: arranging an ink layer surrounding a transparent substrate to form an ink border; forming, on the transparent substrate with the ink border, a vanishing layer made of silicon dioxide ($SiO_2$) and niobium pentoxide ($Nb_2O_5$); sputtering an ITO layer onto the vanishing layer at a high temperature (about 280° C.); and coating a planarization layer onto the ITO layer. Although the ITO layer formed by sputtering at a high temperature has a high degree of crystallization and a good vanishing effect, the planarization layer may be prone to falling off and the high-temperature resistance of the ink is highly demanded. In recent years, a process of sputtering the ITO layer at a low temperature (200° C. to 250° C.) has been introduced to optimize process conditions. In addition, the vanishing effect of the traditional vanishing layer made of $SiO_2$ and $Nb_2O_5$ is not good due to the degree of crystallization of ITO. Furthermore, when a new-type ITO pattern is applied, the process is highly demanded, the production cost is increased, and the yield cannot be guaranteed.

SUMMARY

A main object of the present disclosure is to provide a touch panel manufacturing method, a touch panel, a touch screen and a display device, so as to simplify a process and improve a vanishing effect during the vanishing of a touch panel electrode.

In one aspect, the present disclosure provides in some embodiments a method for manufacturing a touch panel, including steps of: forming, on a transparent substrate, a non-opaque film layer with a micro-pattern; and forming a touch panel electrode on the non-opaque film layer; where the non-opaque film layer is configured to vanish a shadow of the touch panel electrode.

Alternatively, the micro-pattern is of a regular shape.

Alternatively, the step of forming on the transparent substrate the non-opaque film layer with the micro-pattern includes forming the non-opaque film layer on the transparent substrate, and etching the non-opaque film layer to form the micro-pattern.

Alternatively, the non-opaque film layer is an optical anti-reflection film layer.

Alternatively, prior to the step of forming the touch panel electrode on the non-opaque film layer, the method further includes forming an ink border on the non-opaque film layer with the micro-pattern, and subsequent to the step of forming the touch panel electrode on the non-opaque film layer, the method further includes forming a planarization layer on the transparent substrate with the touch panel electrode.

Alternatively, the touch panel electrode is an indium tin oxide (ITO) electrode, and the step of forming the touch panel electrode on the non-opaque film layer further includes forming the touch panel electrode within a predetermined temperature range, where the predetermined temperature range is from 200° C. to 250° C. inclusively.

In another aspect, the present disclosure provides in some embodiments a touch panel, including: a transparent substrate; a non-opaque film layer with a micro-pattern and formed on the transparent substrate; and a touch panel electrode formed on the non-opaque film layer, where the non-opaque film layer is configured to vanish a shadow of the touch panel electrode.

Alternatively, the micro-pattern is of a regular shape.

Alternatively, the non-opaque film layer is an optical anti-reflection film layer.

Alternatively, the touch panel further includes: an ink border formed on the non-opaque film layer with the micro-pattern; and a planarization layer formed on the transparent substrate with the touch panel electrode.

Alternatively, the touch panel electrode is an ITO electrode formed on the non-opaque film layer within a predetermined temperature range, and the predetermined temperature range is from 200° C. to 250° C. inclusively.

Alternatively, the touch panel is a one glass solution (OGS) capacitive touch panel.

In yet another aspect, the present disclosure provides in some embodiments a touch screen including the above-mentioned touch panel.

In still yet another aspect, the present disclosure provides in some embodiments a display device including the above-mentioned touch screen.

According to the method for manufacturing the touch panel, the touch panel, the touch screen and the display device in the embodiments of the present disclosure, different from the related art where a vanishing layer is provided, the non-opaque film layer with the micro-pattern is formed on the transparent substrate. As a result, it is able to control the haze, diffusion, viewing angle and concealment of the micro-pattern to vanish a shadow of the ITO electrode in a better manner, and to simplify the process.

DETAILED DESCRIPTION

The present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "one" or "one of" are merely used to represent the existence of at least one member, rather than to limit the number thereof. Such words as "on", "under", "left" and "right" are merely used to represent relative position relationship, and when an absolute position of the object is changed, the relative position relationship will be changed too.

Figure 1:
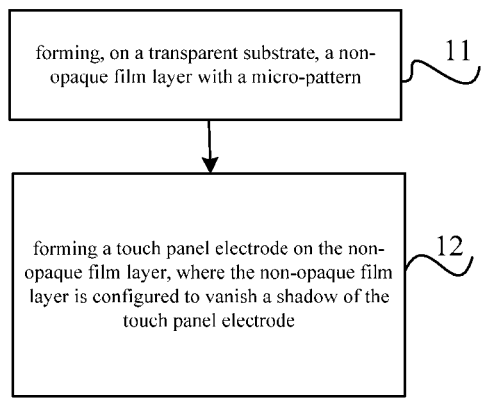
FIG. 1 is a flow chart of a method for manufacturing a touch panel according to one embodiment of the present disclosure.

As shown in FIG. 1, the present disclosure provides in some embodiments a method for manufacturing a touch panel, which includes: Step 11 of forming, on a transparent substrate, a non-opaque film layer with a micro-pattern; and Step 12 of forming a touch panel electrode on the non-opaque film layer, where the non-opaque film layer is configured to vanishing a shadow of the touch panel electrode.

According to the method for manufacturing the touch panel in the embodiments of the present disclosure, different from the related art where a vanishing layer is provided, the non-opaque film layer with the micro-pattern is formed on the transparent substrate. As a result, it is able to control the haze, diffusion, viewing angle and concealment of the micro-pattern to vanish a shadow of the ITO electrode in a better manner, and to simplify the process.

In some embodiments of the present disclosure, the non-opaque film layer may be made of an organic resin material, $SiO_2$ or silicon oxynitride (SiNO), as long as light may transmit through the non-opaque film layer and the micro-pattern may be formed on the non-opaque film layer to change a light path and vanish a shadow of a pattern of the touch panel electrode on the non-opaque film layer. The non-opaque film layer may be formed on the transparent substrate by coating, plating, depositing, etc., which will not be particularly defined herein.

The micro-pattern may be of a regular shape, so as to improve the vanishing effect.

In some embodiments of the present disclosure, the step of forming on the transparent substrate the non-opaque film layer with the micro-pattern includes forming the non-opaque film layer on the transparent substrate and etching the non-opaque film layer to form the micro-pattern. It should be noted that, the required pattern may be formed by exposing, developing and etching the non-opaque film layer, or formed by softening through heating and then impressing the non-opaque film layer. An appropriate process may be selected in accordance with the material of the non-opaque film layer.

Alternatively, the non-opaque film layer may be an optical anti-reflection film layer. Some existing touch panels may each have an optical anti-reflection film layer, and when the optical anti-reflection film layer is selected as the non-opaque film layer and the micro-pattern is formed on the optical anti-reflection film layer, it is able to simplify the process and reduce the production cost.

In the embodiments of the present disclosure, prior to the step of forming the touch panel electrode on the non-opaque film layer, the method further includes forming an ink border on the non-opaque film layer with the micro-pattern.

In the embodiments of the present disclosure, subsequent to the step of forming the touch panel electrode on the non-opaque film layer, the method further includes forming a planarization layer on the transparent substrate with the touch panel electrode.

In the embodiments of the present disclosure, the touch panel electrode may be an ITO electrode or any other touch panel electrode.

Alternatively, the touch panel electrode may be an ITO electrode, and the step of forming the touch panel electrode on the non-opaque film layer further includes forming the touch panel electrode within a predetermined temperature range, where the predetermined temperature range is from 200° C. to 250° C. inclusively.

According to the method in the embodiments of the present disclosure, through forming the ITO electrode by sputtering at a low temperature and forming the optical anti-reflection film layer, it is able to vanish the shadow, reduce the requirement on the high temperature resistance of the ink border, improve the vanishing effect as compared with the related art where a traditional vanishing layer is used in combination with the ITO electrode formed by sputtering at a low temperature, and prevent the planarization layer from being easily fallen off from the transparent substrate at a high temperature. In addition, the existing vanishing layer made of $SiO_2$ and $Nb_2O_5$ is not required, so it is able to simple the process.

The present disclosure further provides in some embodiments a touch panel, which includes: a transparent substrate; a non-opaque film layer with a micro-pattern and formed on a transparent substrate; and a touch panel electrode formed on the non-opaque film layer, where the non-opaque film layer is configured to vanish the shadow of the touch panel electrode.

According to the touch panel in the embodiments of the present disclosure, different from the related art where a vanishing layer is provided, the non-opaque film layer with the micro-pattern is formed on the transparent substrate. As a result, it is able to control the haze, diffusion, viewing angle and concealment of the micro-pattern to vanish a shadow of the ITO electrode in a better manner, and to simplify the process.

Alternatively, the micro-pattern is of a regular shape, so as to improve the vanishing effect. It should be noted that, the micro-pattern may further correspond to a pattern of the touch panel electrode, so as to vanish the shadow of the pattern of the touch panel electrode in a better manner.

Alternatively, the non-opaque film layer may be an optical anti-reflection film layer, and the non-opaque film layer may be an optical anti-reflection film layer. Some existing touch panels may each have an optical anti-reflection film layer, and when the optical anti-reflection film layer is selected as the non-opaque film layer and the micro-pattern is formed on the optical anti-reflection film layer, it is able to simplify the process and reduce the production cost.

In the embodiments of the present disclosure, the touch panel may further include: an ink border formed on the non-opaque film layer with the micro-pattern, where the ink border may be plated onto the non-opaque film layer with the micro-pattern.

In the embodiments of the present disclosure, the touch panel may further include: a planarization layer formed on the transparent substrate with the touch panel electrode, where the planarization layer may be formed by coating.

In the embodiments of the present disclosure, the touch panel electrode may be an ITO electrode or any other touch panel electrode.

Alternatively, the touch panel electrode may be an ITO electrode formed on the non-opaque film layer within a predetermined temperature range, and the predetermined temperature range is from 200° C. to 250° C. inclusively.

According to the method in the embodiments of the present disclosure, through forming the ITO electrode by sputtering at a low temperature and forming the optical anti-reflection film layer, it is able to vanish the shadow, reduce the requirement on the high temperature resistance of the ink border, improve the vanishing effect as compared with the related art where a traditional vanishing layer is used in combination with the ITO electrode formed by sputtering at a low temperature, and prevent the planarization layer from being easily fallen off from the transparent substrate at a high temperature.

Alternatively, the touch panel may be an OGS capacitive touch panel. For an existing OGS capacitive touch panel including a vanishing layer, a vanishing effect of the ITO pattern is not significant when the ITO pattern is formed by sputtering at a low temperature (200° C. to 250° C.). In the embodiments of the present disclosure, a better vanishing effect may be obtained when the ITO electrode is formed by sputtering at a low temperature. In some other embodiments of the present disclosure, any other touch panel may also be used.

The method for manufacturing the touch panel and the touch panel will be described hereinafter.

Figure 2:
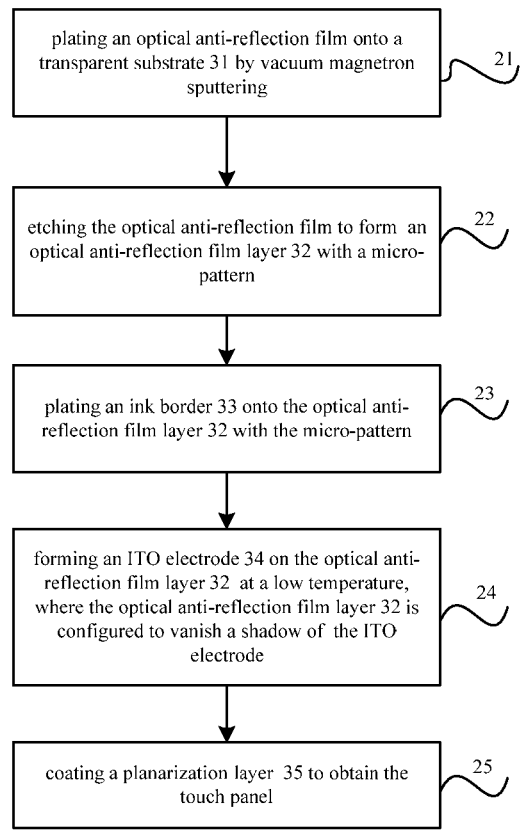
FIG. 2 is another flow chart of the method for manufacturing the touch panel according to one embodiment of the present disclosure.
Figure 3:
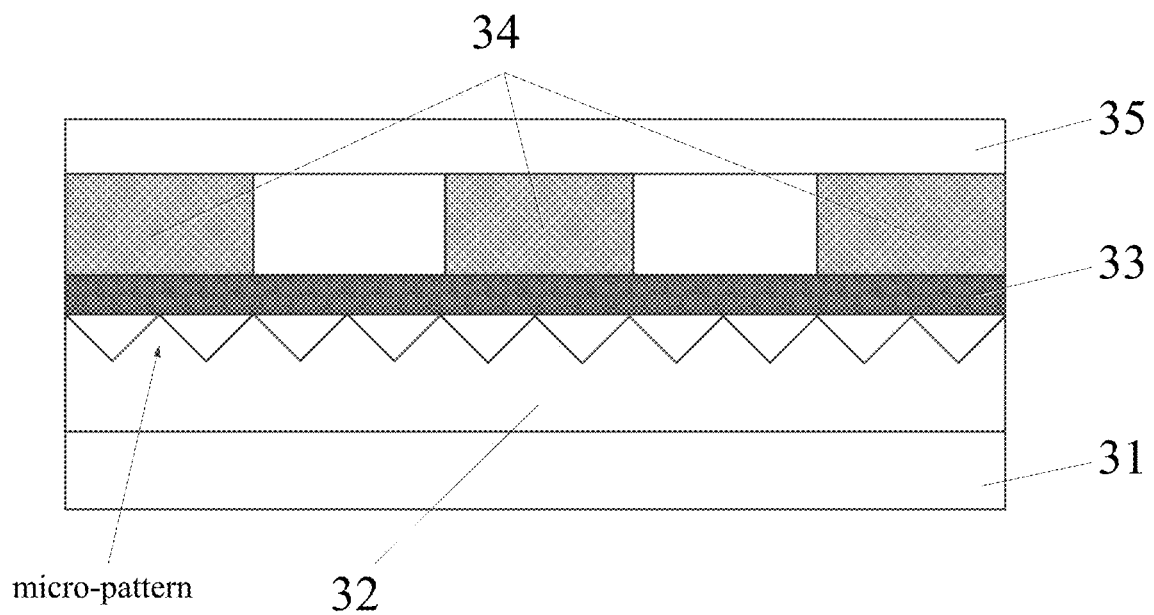
FIG. 3 is a schematic view showing a touch panel according to one embodiment of the present disclosure.
Figure 4:
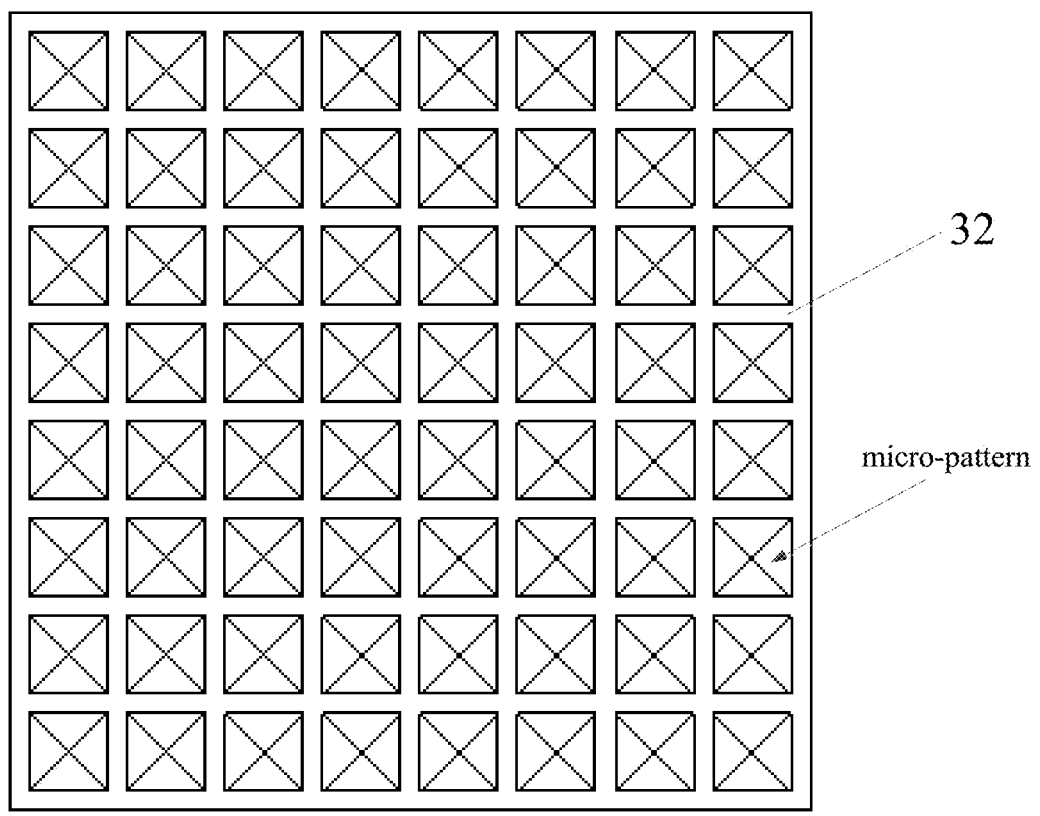
FIG. 4 is a top view of a micro-pattern formed by etching an optical anti-reflection film of the touch panel according to one embodiment of the present disclosure.

FIG. 2 is a flow chart of the method for manufacturing the touch panel according to one embodiment of the present disclosure, and FIG. 3 is a schematic view showing the touch panel manufactured by the method. FIG. 3 shows an arrangement mode of the micro-patterns, i.e., a serrated mode. However, the arrangement mode is not limited thereto, and the micro-pattern as shown in FIG. 4 may also be used.

At first, Step 21 is performed, i.e., an optical anti-reflection film is plated onto the transparent substrate 31 by vacuum magnetron sputtering.

Step 22 is then performed, i.e., the optical anti-reflection film is etched so as to form the optical anti-reflection film layer 32 with the micro-pattern.

Next, Step 23 is performed, i.e., the ink border 33 is plated onto the optical anti-reflection film layer 32 with the micro-pattern.

Then, Step 24 is performed, i.e., the ITO electrode 34 is formed on the optical anti-reflection film layer 32 by vacuum sputtering, exposing, developing and etching at a low temperature (200° C. to 250° C.), where the optical anti-reflection film layer 32 is configured to vanish the shadow of the ITO electrode.

Finally, the planarization layer 35 (e.g., a resin protective layer) is coated onto the optical anti-reflection film layer 32, so as to obtain the touch panel.

The micro-pattern 4 in FIG. 4 is formed on the optical anti-reflection film by etching (the micro-pattern in FIG. 4 is of a regular shape, so as to provide the vanishing effect in a better manner). It should be noted that, the arrangement mode of the micro-pattern in FIG. 4 is merely for illustrative purposes, and any other arrangement mode may also be applied. Through adjusting the shape of the micro-pattern, it is able to control the haze, diffusion, viewing angle and concealment thereof, thereby to vanish the shadow of the ITO pattern when a low-temperature ITO process is introduced.

The present disclosure further provides in some embodiment a touch screen including the above-mentioned touch panel.

The present disclosure further provides in some embodiments a display device including the above-mentioned touch screen. The display device may be a liquid crystal display, a liquid crystal television, an organic light emitting diode (OLED) panel, an OLED display, an OLED television or an electronic paper.

The above are merely the preferred embodiments of the present disclosure. It should be noted that, a person skilled in the art may make further modifications and improvements without departing from the principle of the present disclosure, and these modifications and improvements shall also fall within the scope of the present disclosure.

What is claimed is:

1. A method for manufacturing a touch panel, comprising steps of:
    forming, on a transparent substrate, a non-opaque film layer with a plurality of micro-patterns;
    forming an ink border on the non-opaque film layer with the micro-patterns;
    forming a touch panel electrode on the non-opaque film layer; and
    forming a planarization layer on the touch panel electrode,
    wherein the non-opaque film layer is configured to vanish a shadow of the touch panel electrode;
    the planarization layer is on a surface of the touch panel electrode away from the non-opaque film layer, and the planarization layer is in a physical contact with the touch panel electrode;
    wherein the touch panel further comprises an ink border on the non-opaque film layer, the touch panel electrode is at a side of the ink border away from the non-opaque film layer;
    the plurality of micro-patterns are separated from the touch panel electrode; and
    the plurality of micro-patterns and the touch panel electrode are respectively arranged at a side of the ink border adjacent to the transparent substrate and a side of the ink border adjacent to the planarization layer.

2. The method according to claim 1, wherein the step of forming on the transparent substrate the non-opaque film layer with the micro-patterns comprises:
    forming the non-opaque film layer on the transparent substrate, and etching the non-opaque film layer to form the micro-patterns.

3. The method according to claim 1, wherein the non-opaque film layer is an optical anti-reflection film layer.

4. The method according to claim 1, wherein the touch panel electrode is an indium tin oxide (ITO) electrode, the step of forming the touch panel electrode on the non-opaque film layer further comprises forming the touch panel electrode within a predetermined temperature range, and the predetermined temperature range is from 200° C. to 250° C. inclusively.

5. A touch panel, comprising: a transparent substrate;
    a non-opaque film layer with a plurality of micro-patterns and formed on the transparent substrate;
    a touch panel electrode formed on the non-opaque film layer; and a planarization layer on the touch panel electrode, wherein the non-opaque film layer is configured to vanish a shadow of the touch panel electrode;

the planarization layer is on a surface of the touch panel electrode away from the non-opaque film layer, and the planarization layer is in a physical contact with the touch panel electrode, wherein the touch panel further comprises an ink border on the non-opaque film layer, the touch panel electrode is at a side of the ink border away from the non-opaque film layer; the plurality of micro-patterns are separated from the touch panel electrode; and the plurality of micro-patterns and the touch panel electrode are respectively arranged at a side of the ink border adjacent to the transparent substrate and a side of the ink border adjacent to the planarization layer.

6. The touch panel according to claim 5, wherein the non-opaque film layer is an optical anti-reflection film layer.

7. The touch panel according to claim 5, wherein the touch panel electrode is an indium tin oxide (ITO) electrode formed on the non-opaque film layer within a predetermined temperature range, and the predetermined temperature range is from 200° C. to 250° C. inclusively.

8. The touch panel according to claim 5, wherein the touch panel is a one glass solution (OGS) capacitive touch panel.

9. A touch screen, comprising the touch panel according to claim 5.

10. A display device, comprising the touch screen according to claim 9.

11. The method according to claim 1, wherein the step of forming on the transparent substrate the non-opaque film layer with the micro-patterns comprises:

forming the non-opaque film layer on the transparent substrate, and etching the non-opaque film layer to form the micro-patterns.

12. The method according to claim 1, wherein the non-opaque film layer is an optical anti-reflection film layer.

13. The method according to claim 1, wherein the touch panel electrode is an ITO electrode, the step of forming the touch panel electrode on the non-opaque film layer further comprises forming the touch panel electrode within a predetermined temperature range, and the predetermined temperature range is from 200° C. to 250° C. inclusively.

* * * * *